United States Patent
Boris et al.

(10) Patent No.: US 8,190,366 B2
(45) Date of Patent: May 29, 2012

(54) LC RESONANCE PROBE FOR DETERMINING LOCAL PLASMA DENSITY

(75) Inventors: David R. Boris, Washington, DC (US); David D. Blackwell, Alexandria, VA (US); David N. Walker, Arlington, VA (US); Richard F. Fernsler, Annandale, VA (US); Scott G. Walton, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/250,050

(22) Filed: Sep. 30, 2011

(65) Prior Publication Data

US 2012/0084046 A1    Apr. 5, 2012

Related U.S. Application Data

(60) Provisional application No. 61/388,661, filed on Oct. 1, 2010.

(51) Int. Cl.
*G01R 29/24*  (2006.01)
*G01R 29/00*  (2006.01)
*G06F 19/00*  (2011.01)
*G06F 17/40*  (2006.01)

(52) U.S. Cl. ........... 702/1; 73/865.8; 702/187; 702/189; 708/105; 708/200

(58) Field of Classification Search ................. 73/432.1, 73/865.8, 866, 866.5; 250/305; 324/71.1, 324/71.3, 71.4; 702/1, 127, 137, 187, 189; 708/100, 105, 131, 160, 200

See application file for complete search history.

(56) References Cited

U.S. PATENT DOCUMENTS
3,381,132 A * 4/1968 Okano ..................... 250/310
(Continued)

FOREIGN PATENT DOCUMENTS
WO    WO 99/24807 A2  *  5/1999

OTHER PUBLICATIONS

Boris et al: "The LC Resonance probe for determining local plasma density," Plasma Sources Sci. Technol. 20 (2011) 025003, Feb. 17, 2011.*

(Continued)

*Primary Examiner* — Edward Cosimano
(74) *Attorney, Agent, or Firm* — Amy Ressing; Joslyn Barritt

(57) ABSTRACT

An apparatus and method for determining plasma parameters such as plasma electron density $n_e$. The probe apparatus includes an LC resonance probe comprising an inductive element and a capacitive element connected in series. The capacitive element of the probe can be in the form of a parallel plate capacitor, a cylindrical capacitor, a spherical capacitor, or any other suitable capacitor. The configuration of the probe apparatus gives it a characteristic resonance frequency $\omega_{R0}$ which can be determined by a circuit analysis device. When the capacitive element of the probe apparatus is placed in a plasma, the probe exhibits a new resonance frequency $\omega_R$, which is different from $\omega_{R0}$ because of the dielectric constant $\in$ of the plasma. The difference in resonance frequencies can be used to determine plasma density $n_e$, where $$n_e = \frac{m_e \varepsilon_0}{e^2}(\omega_R^2 - \omega_{R0}^2).$$

15 Claims, 9 Drawing Sheets

U.S. PATENT DOCUMENTS

| | | | | |
|---|---|---|---|---|
| 5,705,931 | A * | 1/1998 | Klick | 324/464 |
| 5,861,752 | A * | 1/1999 | Klick | 324/464 |
| 6,014,029 | A * | 1/2000 | Soto et al. | 324/664 |
| 7,339,656 | B2 * | 3/2008 | Matsumoto et al. | 356/72 |
| 7,462,293 | B2 * | 12/2008 | Matsumoto et al. | 216/59 |
| 7,532,322 | B2 * | 5/2009 | Koshimizu et al. | 356/316 |
| 7,582,182 | B2 * | 9/2009 | Matsumoto et al. | 156/345.24 |
| 2005/0009347 | A1 * | 1/2005 | Matsumoto et al. | 438/689 |
| 2007/0089835 | A1 * | 4/2007 | Koshimizu et al. | 156/345.29 |
| 2007/0193514 | A1 * | 8/2007 | Matsumoto et al. | 118/723.001 |
| 2007/0284044 | A1 * | 12/2007 | Matsumoto et al. | 156/345.29 |

OTHER PUBLICATIONS

N. Hershkowitz, 1989, Plasma Diagnostics vol. I (New York, NY: Academic Press) pp. 113-121.

R. S. Harp and F. W. Crawford, "Characteristics of the Plasma Resonance Probe," J. Appl. Phys. 35, 3436 (1964).

R. L. Stenzel, "Microwave Resonator Probe for Localized Density Measurements in Weakly Magnetized Plasmas," Rev. Sci. Inst. 47, 5, 603 (1976).

T. Shirakawa and H. Sugai, "Plasma Oscillation Method for Measurements of Absolute Electron Density in a Plasma," Jpn. J. Appl. Phys. 32, 5129 (1993).

D. N. Walker, R. F. Fernsler, D. D. Blackwell, and W. E. Amatucci, "On collisionless energy absorption in plasmas: Theory and experiment in spherical geometry," Phys. Plasmas 13, 032108 (2006).

R. B. Piejak, V. A. Godyak, R. Garner, and B. M. Alexandrovich "The hairpin resonator: A plasma density measuring technique revisited," J. Appl. Phys. 95, 7 (2004).

D. G. Swanson, 2003, Plasma Waves 2nd Edition (Philadelphia, PA: IOP Publishing), p. 24.

K. Balmain, "Impedance of a Spherical Probe in a Magnetoplasma," IEEE Trans. Antennas Propag. AP-14, 402 (1966).

D. D. Blackwell, D. N. Walker, S. J. Messer, and W. E. Amatucci "Antenna impedance measurements in a magnetized plasma. I. Spherical antenna," Phys. Plasmas 14, 092105 (2007).

D.R. Boris, S. G. Walton, M. Baraket, R. F. Fernsler, "Frequency Probe Measurements in Electron Beam Generated Plasmas," Proceedings of the 53rd Society of Vacuum Coaters Technical Conference, Orlando FL (2010).

* cited by examiner

LC RESONANCE PROBE FOR DETERMINING LOCAL PLASMA DENSITY

CROSS-REFERENCE

This application claims the benefit of priority based on expired U.S. Provisional Patent Application No. 61/388,661 filed on Oct. 1, 2010, the entirety of which is hereby incorporated by reference into the present application.

TECHNICAL FIELD

The present invention relates to plasma physics and the determination of plasma parameters, particularly to the determination of local plasma densities and plasma density profiles.

BACKGROUND

A plasma consists of a system of charged particles that exhibits collective behavior due to long range electrostatic and electromagnetic interactions between the particles. Plasmas have a variety of applications, ranging from controlled nuclear fusion to materials processing, and can affect spacecraft operating in planetary orbits or in deep space.

Measurements of plasma parameters such as plasma electron density are an integral part of the characterization of plasmas. The most common diagnostic tool for this measurement is the Langmuir probe, which uses changes in charged particle flux as a function of applied voltage to measure the DC plasma impedance, which in turn can be used to determine the characteristics of such plasma parameters. See N. Hershkowitz, 1989, *Plasma Diagnostics* Vol. I (New York, N.Y.: Academic Press) pp. 113-121.

In spite of their common usage, Langmuir probes are of limited utility in a number of plasma environments. In many materials processing plasmas, the probe surface is modified when it is placed into the plasma, e.g., through the deposition of insulating material which prevents charge collection, or the deposition of metal, which changes the probe's surface area and in turn the measured surface current, rendering the probe ineffectual. In low-density space plasmas, Langmuir probe measurements are highly geometry and orientation-dependent due to large sheaths and the effects of magnetic fields, further limiting their utility in such cases.

To overcome these shortcomings of Langmuir probes, some researchers have used radiofrequency (RF) probes to determine plasma parameters such as plasma potential, plasma temperatures, and plasma density. See R. S. Harp and F. W. Crawford, "Characteristics of the Plasma Resonance Probe," *J. Appl. Phys.* 35, 3436 (1964); R. L. Stenzel, "Microwave Resonator Probe for Localized Density Measurements in Weakly Magnetized Plasmas," *Rev. Sci. Inst.* 47, 5, 603 (1976); T. Shirakawa and H. Sugai, "Plasma Oscillation Method for Measurements of Absolute Electron Density in a Plasma," *Jpn. J. Appl. Phys.* 32, 5129 (1993); and D. N. Walker, R. F. Fernsler, D. D. Blackwell, and W. E. Amatucci, "On collisionless energy absorption in plasmas: Theory and experiment in spherical geometry," *Phys. Plasmas* 13, 032108 (2006).

Another type of probe that has been used to measure plasma density is the hairpin resonator, which measures plasma density by noting the shift in the cavity resonance of a U-shaped wire. See R. B. Piejak, V. A. Godyak, R. Garner, and B. M. Alexandrovich "The hairpin resonator: A plasma density measuring technique revisited," *J. Appl. Phys.* 95, 7 (2004). However, the hairpin resonator requires the presence of a standing wave between ends of the wire, and is thus limited in the plasma densities that it can measure.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a method and an apparatus for determining plasma parameters such as plasma electron density $n_e$.

The method of the present invention can be accomplished using an apparatus that includes an LC resonance probe ("LCR probe") element comprising an inductive element and a capacitive element connected in series. The probe element is connected to a transmission line which is connected to an AC voltage source and circuit analysis equipment. A processor configured to receive and process data from the probe also forms part of the apparatus, either as part of or connected to the circuit analysis equipment and configured to receive and process data directly from the probe or as a separate device configured to receive data from a data storage device.

In accordance with one embodiment of the present invention, the capacitive element of the probe is placed into the plasma and an AC voltage signal, which varies over a range of frequencies, is applied to the probe. As a function of frequency, the circuit analysis element of the probe measures the magnitude and phase characteristics of the reflected power from the LC circuit element terminating the transmission line. The circuit analysis equipment and processor then calculate the ratio of the reflected power to the applied power at each frequency, which then determines the complex reflection coefficient $\Gamma$ of the probe at each frequency. Based on the complex reflection coefficient and the known internal impedance $Z_0$ of the circuit analysis equipment, the processor then calculates $Z_P$, the probe impedance in the presence of a plasma, at each applied frequency. The processor, either as part of the measurement process or as a stored data element, has also measured the complex reflection coefficient and calculated probe impedance, $Z_{P0}$, for the probe outside the plasma at each applied probe frequency.

In some embodiments, the processor then determines a functional relationship between the absolute values of $Z_P$ and $Z_{P0}$ and the applied frequency, while in other embodiments the processor plots $|Z_P|$ and $|Z_{P0}|$ a function of the applied frequency, but in either embodiment, in the next step the processor finds the frequency at which $|Z_P|$ and $|Z_{P0}|$ exhibits a minimum, where the frequency at which $|Z_P|$ exhibits a minimum being a resonance frequency $\omega_R$ of the probe and the frequency at which $|Z_{P0}|$ exhibits a minimum being a characteristic resonance frequency $\omega_{R0}$ of the probe.

In other embodiments, the processor plots $|Z_P|$ and $|Z_{P0}|$ as a function of the applied frequency and then determines the phase angle of the impedance at each applied probe frequency when the probe is outside the plasma ($\theta_{P0}$) and when the probe is inserted into the plasma ($\theta_P$). The processor then determines the frequency at which there is a zero crossing of the phase angle, with the resonance frequency $\omega_R$ of the probe being the frequency at which the phase angle $\theta_P$ exhibits a zero crossing and the characteristic resonance frequency $\omega_{R0}$ being the frequency at which the phase angle $\theta_{P0}$ exhibits a zero crossing.

In some embodiments the values of one or more of the reflected and applied power, complex reflection coefficient Γ, $|Z_P|$, $|Z_{P0}|$, $\theta_P$, $\theta_{P0}$, $\omega_R$, and $\omega_{R0}$ are determined by a processor forming part of or connected to the probe's circuit analysis equipment for real-time or near real-time analysis and determination of the plasma electron density $n_e$. In other embodiments, one or more of reflected and applied power, complex reflection coefficient Γ, $|Z_P|$, $|Z_{P0}|$, $\theta_P$, $\theta_{P0}$, $\omega_R$, and $\omega_{R0}$ can be stored in a data storage medium and input into a separate processor for later analysis and determination of the plasma electron density $n_e$.

In either case, in all embodiments, using the values of $\omega_R$ and $\omega_{R0}$ found using the probe, the processor then calculates the plasma electron density $n_e$, where $$n_e = \frac{m_e \varepsilon_0}{e^2}(\omega_R^2 - \omega_{R0}^2),$$

$-e$ is the electron charge, $\varepsilon_0$ is the vacuum permittivity, and $m_e$ is the electron mass.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a method for determining plasma electron density $n_e$ from the change in resonance frequency measured using an LC resonance probe placed into a plasma.

The method of the present invention can be accomplished using an apparatus that includes an LC resonance probe ("LCR probe") element comprising an inductive element and a capacitive element connected in series. The probe element is connected to a transmission line which is connected to an AC voltage source and circuit analysis equipment. A processor configured to receive and process data from the probe also forms part of the apparatus, either as part of or connected to the circuit analysis equipment and configured to receive and process data directly from the probe or as a separate device configured to receive data from a data storage device.

As described in more detail below, in accordance with the present invention, an appropriately configured LCR probe can be placed into a plasma and the resonance frequency $\omega_R$, of the probe when it is in a plasma can be determined. This resonance frequency is different from the probe's characteristic resonance frequency $\omega_{R0}$ when it is outside the plasma. Based on this difference in resonance frequencies, the plasma electron density $n_e$ can be determined:

$$n_e = \frac{m_e \varepsilon_0}{e^2}(\omega_R^2 - \omega_{R0}^2)$$

where $-e$ is the electron charge, $\varepsilon_0$ is the vacuum permittivity, and $m_e$ is the electron mass.

In some embodiments the values of the reflected and applied power, complex reflection coefficient Γ, $|Z_P|$, $|Z_{P0}|$, $\omega_R$, and $\omega_{R0}$ are determined by a processor forming part of or connected to the probe's circuit analysis equipment for real-time or near real-time analysis and determination of the plasma electron density $n_e$. In other embodiments, one or more of reflected and applied power, complex reflection coefficient Γ, $|Z_P|$, $|Z_{P0}|$, $\omega_R$, and $\omega_{R0}$ can be stored in a data storage medium and input into a separate processor for later analysis and determination of the plasma electron density $n_e$.

Figure 1:
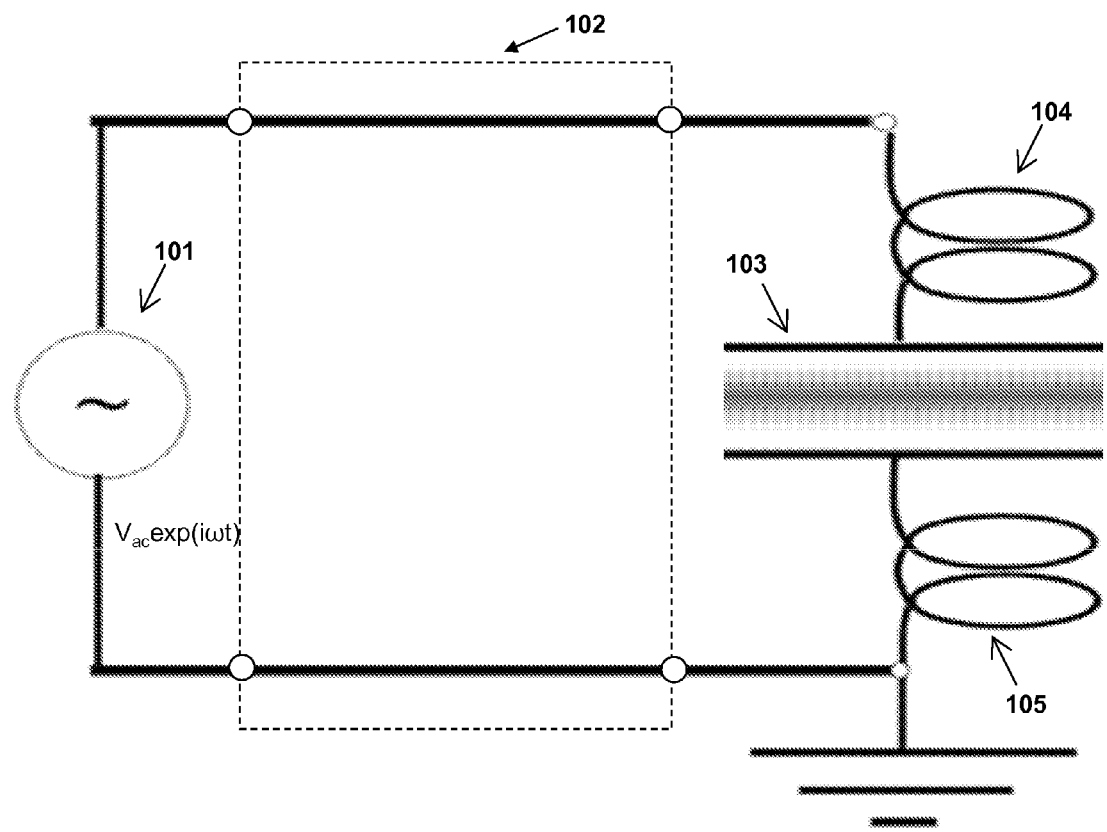
FIG. 1 is a block diagram depicting an equivalent circuit for an LC resonance probe in accordance with the present invention.

The probe can generally be represented as capacitive and inductive elements in series, connected to a variable voltage source, as illustrated in the equivalent circuit shown in FIG. 1. The variable voltage source 101 provides AC, variable frequency, voltage to the probe. The transmission line 102 connects the voltage source with probe element. The capacitive component 103 accounts for charge stored on the object and dominates at low frequency, while the inductive components 104, 105 account for current flowing through the object and dominate at high frequency.

The impedance $Z_{P0}$ of the LCR probe is a function of the inductive L and capacitive C elements of the probe, i.e., $$Z_P = i\omega L + \frac{1}{i\omega C}.$$

The capacitance of the probe is given by $C = C_0 \varepsilon$, where $C_0$ is the probe's intrinsic capacitance resulting from the geometry of the capacitive element and $\varepsilon$ is dielectric constant of the medium surrounding the capacitive element. For free space $\varepsilon = 1$.

At the resonance frequency $\omega_R$ of the probe, the high frequency and low frequency effects of the impedance Z cancel, so that $$Z_P = i\omega L + \frac{1}{i\omega C} = 0 \text{ and } \omega_R = \frac{1}{\sqrt{LC}}.$$

It should be noted that in practice the condition Z=0 will never be reached since no physical system has zero impedance. Instead, a minimum will occur at the resonance frequency, with the lower limit being the resistance of the conductive elements used to assemble the circuit. In the presence of a plasma, the lower limit on the impedance is set by the resistance of the plasma.

Thus, for the equivalent circuit shown in FIG. 1, the LC resonance frequency of the probe in the plasma can be expressed as $$\omega_R = \sqrt{\left(\frac{1}{LC_0\varepsilon}\right)}.$$

In the absence of a plasma (i.e., where $\varepsilon=1$), the particular configuration of the LC resonance probe causes it to have a characteristic resonance frequency $$\omega_{R0} = \sqrt{\left(\frac{1}{LC_0}\right)},$$

which can be measured with the circuit analysis equipment or input as a data element into the computer. $\omega_{R0}$ is thus a function of the probe geometry, where L is the inductance resulting from the configuration of the inductive element and $C_0$ is, as noted above, the probe intrinsic capacitance resulting from the geometry of the capacitive element.

In accordance with the present invention, the probe should be configured such that $\omega_{R0}$ obeys the constraint $\omega_{R0} \gg \omega_{ce}\omega_{pe}$, where $\omega_{pe}$ is the local electron plasma frequency and $\omega_{ce}$ is the electron cyclotron frequency described in more detail below. Because $\omega_{R0}$ is a function of probe geometry, it can be tuned by changing the surface area of the capacitive elements of the probe or by adding inductance to the leads attached to the capacitive elements.

As described in more detail below, in accordance with the present invention, the resonance frequencies $\omega_R$ and $\omega_{R0}$ can be determined from the impedance of a properly configured probe when it is within the plasma and when it is outside the plasma, and the values of $\omega_R$ and $\omega_{R0}$ thus found can be used to determine plasma electron density $n_e$.

The measurement of the probe impedances relies on the user's ability to properly calibrate the probe to eliminate stray capacitances and inductances, and the impedance contributions from the rigid coax transmission line. This is done by terminating the transmission line with a load matched to internal impedance of the circuit analysis equipment and transmission line (e.g. 50Ω), an electrical short, and no load (i.e. open termination) which are calibrated to provide Γ values of 0, −1, and 1, respectively. This allows stray capacitance from the cabling and other components to be eliminated. This procedure is explained in detail in Walker et al., supra, and Blackwell et al., supra, both of which are hereby incorporated by reference into the present application in their entirety. In practice, the length of rigid coax and coaxial cable should be minimized so as to minimize the inductance and capacitance introduced by these components.

Once the calibration is completed, the circuit analysis equipment can measure the location in frequency space of the LC resonance associated with the LCR probe.

In accordance with the present invention, in an exemplary embodiment, the capacitive element of the probe can be inserted into the plasma and the AC voltage source applies a frequency to the probe in a series of frequency steps. The circuit analysis equipment can measure the ratio of (1) the power and phase of the signal reflected back from the probe and transmission line (with or without plasma filling the volume between the capacitive elements of the probe) to (2) the power and phase of the signal initially generated by the AC voltage source. This power ratio (1):(2) can be monitored by the circuit analysis equipment as a function of the frequency applied to the probe and defines the complex reflection coefficient Γ of the transmission line and LC resonance circuit.

The reflection coefficient Γ is related to $Z_T$, the total impedance of the transmission line and probe circuit, by the expression $$\Gamma = \frac{Z_T - Z_0}{Z_T + Z_0},$$

where $Z_T = Z_P + Z_L$, $Z_P$ is the impedance contribution from the LCR probe described above, $Z_L$ is the impedance contribution from the transmission line, and $Z_0$ is the internal impedance of the circuit analysis equipment connected to the probe, for example, 50Ω. As described in more detail below, the contribution to $Z_T$ from the transmission line can be calibrated out, leaving a only relation between $Z_P$, the impedance of the probe circuit, and Γ, where $$Z_P = Z_0 \frac{1 + \Gamma}{1 - \Gamma}.$$

Further information about transmission line theory can be found in any advanced electromagnetics text and would be well known to one skilled in the art.

Using the values of Z, the resonance frequencies $\omega_R$ and $\omega_{R0}$ can be determined as now described.

The resonance frequency is marked by two distinguishing features: (1) a minimum in the frequency-dependent absolute value |Z| of the impedance calculated from the complex reflection coefficient measured by the probe and (2) a shift in phase angle from −90° to +90° as the impedance changes from capacitive to inductive. Where the phase angle is the angular offset between the voltage and current components of the signal propagating along the transmission line and reflecting off of or being absorbed by the probe terminating the rigid coax. Further information about this can be found in any advanced electromagnetics text.

Figure 2:
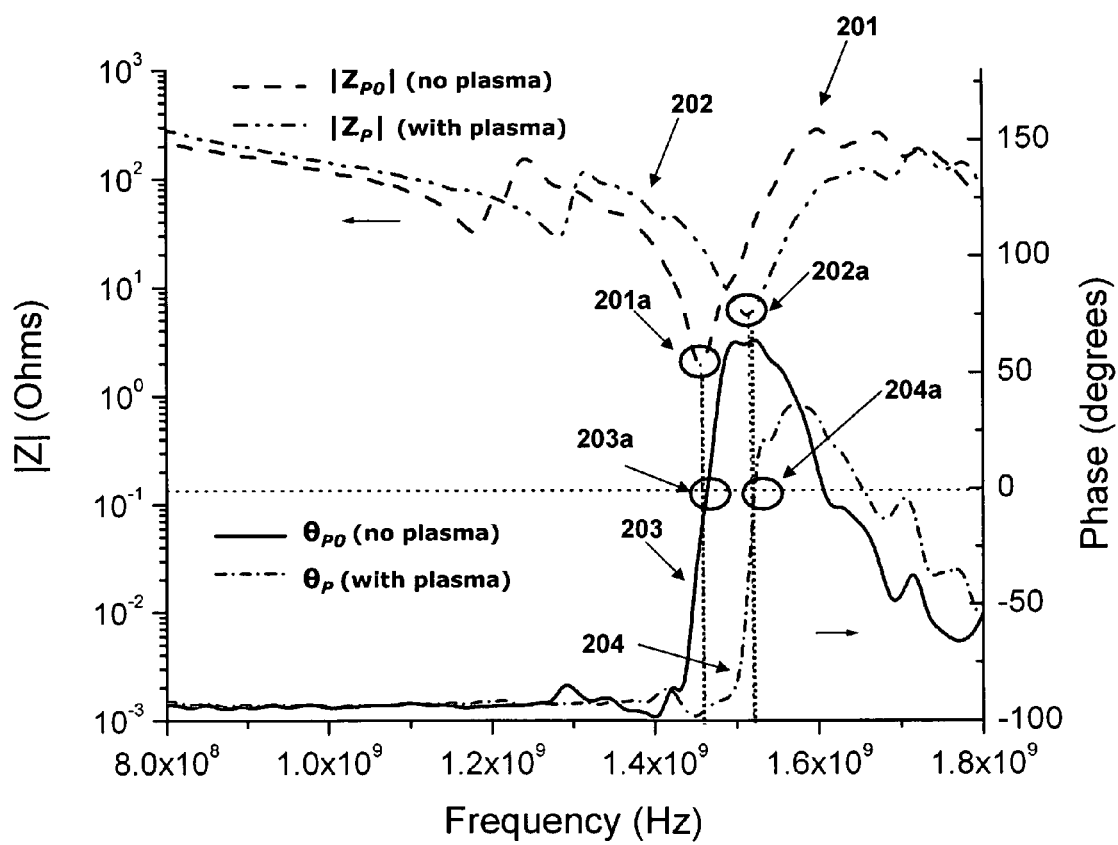
FIG. 2 contains plots showing the magnitude of the impedance and of the phase shift between outgoing and reflected power for an LC resonance probe placed in a plasma in accordance with the present invention.

In some embodiments, the values of Z can be plotted against the frequencies applied to the probe, for example, in the plots shown in FIG. 2. Plots 201/202 illustrate the values of impedance Z (in absolute value, as measured on the left-hand axis) calculated by the computer for each applied probe frequency when the probe is outside the plasma ($|Z_{P0}|$–plot 201) and when the probe is inserted into the plasma ($|Z_P|$–plot 202). Plots 203/204 illustrate the phase angle (measured on the right-hand axis) at each applied probe frequency when the probe is outside the plasma ($\theta_{P0}$–plot 203) and when the probe is inserted into the plasma ($\theta_P$–plot 204).

As illustrated in FIG. 2, in the absence of a plasma, $|Z_{P0}|$ plotted in plot 201 reaches a minimum 201a at an applied frequency of about 1.46×10⁹ Hz; this frequency, multiplied by 2π, is the characteristic resonance frequency $\omega_{R0}$ of the probe in rad/s. In the presence of a plasma, i.e., when the probe is inserted into a plasma, $|Z_P|$, plotted in plot 202 reaches a minimum 202a at an applied frequency of about $1.52 \times 10^9$ Hz, i.e., $\omega_R = 2\pi \cdot 1.52 \times 10^9$ rad/s.

Alternatively, the resonance frequency can be found by noting the frequency at which there is a zero-crossing of the phase angle θ. The locations in frequency space of the zero-crossings for the phase angle are denoted by 203a and 204a for the cases without and with plasma respectively. The zero-crossings of the phase yield resonant frequency values that are identical with those found above, i.e., $\omega_{R0} = 2\pi \cdot 1.46 \times 10^9$ rad/s without plasma and $\omega_R = 2\pi \cdot 1.52 \times 10^9$ with plasma.

Of course, one skilled in the art would readily recognize that an appropriately programmed computer can simply determine the maximum/minimum values of $|Z_{P0}|$ and $|Z_P|$ or the zero-crossing of the phase angles $\theta_P$ and $\theta_{P0}$ as a function of applied frequency, and that therefore in some embodiments the plotting steps described above can be omitted in determining $\omega_R$ and $\omega_{R0}$.

Thus, in accordance with the present invention, the electron density $n_e$ of the plasma between the probe plates can be determined by placing an LCR probe into the plasma finding the values of the resonance frequency of the probe in the presence of the plasma $\omega_R$ and the characteristic resonance frequency $\omega_{R0}$ of the probe itself based on the impedances of the probe inside and outside the plasma, and once the values of $\omega_R$ and $\omega_{R0}$ are found, $n_e$ can be determined as described below.

The dielectric constant $\in$ responsible for the change in the probe's LC resonance frequency in the plasma can be defined by the cold plasma dielectric tensor $\in_p$:

$$\varepsilon_p = \begin{pmatrix} S & -iD & 0 \\ iD & S & 0 \\ 0 & 0 & P \end{pmatrix}.$$

in which $$S = 1 - \frac{\omega_{pe}^2}{\omega^2 - \omega_{ce}^2}, \; D = \frac{\omega_{ce}\omega_{pe}^2}{\omega(\omega - \omega_{ce}^2)}, \text{ and } P = 1 - \frac{\omega_{pe}^2}{\omega^2}$$

See D. G. Swanson, 2003, *Plasma Waves 2nd Edition* (Philadelphia, Pa.: IOP Publishing), p. 24. At the probe's LC resonance frequency, $\omega = \omega_R$.

In the equations above, $\omega_{pe}$ is the local electron plasma frequency, $\omega_{ce}$ is the electron cyclotron frequency where $$\omega_{pe} = \sqrt{\left(\frac{e^2 n_e}{\varepsilon_0 m_e}\right)}$$

and $\omega_{ce}$ is governed by the magnitude B of the magnetic field to which the plasma is subjected, with $\omega_{ce} \approx 2.8 \times 10^6 \cdot B$ (gauss) and the magnetic field B assumed to be along the z direction.

When a properly configured probe having a geometry such that $\omega_{R0} \gg \omega_{ce}, \omega_{pe}$ described above is inserted into a plasma, $S \approx P$, $D \approx 0$, and $\in_p$ reduces to $$\varepsilon_p = \left(1 - \frac{\omega_{pe}^2}{\omega_R^2}\right) I$$

where I is the identity tensor.

When the probe is inserted into the plasma, $\in = \in_p$ implying that $$\omega_R = \sqrt{\frac{1}{LC_0 \varepsilon_p}}.$$

From the expression for $\in_p$ above, $$\omega_R = \sqrt{\frac{1}{LC_0\left(1 - \frac{\omega_{pe}^2}{\omega_R^2}\right)}} \text{ and } \omega_R^2 - \omega_{pe}^2 = \frac{1}{LC_0}.$$

As noted previously, $$\omega_{R0}^2 = \frac{1}{LC_0}$$

and therefore, $\omega_{pe}^2 = \omega_R^2 - \omega_{R0}^2$ and $$n_e = \frac{m_e \varepsilon_0}{e^2}(\omega_R^2 - \omega_{R0}^2).$$

In addition, since the LCR probe makes plasma density measurements by tracking changes in the resonance frequency of the probe $\omega_R$ and because the frequency is related to the dielectric constant $\in$, one skilled in the art would readily recognize that the LCR probe methods in accordance with the present invention can also be used to measure the dielectric constant of the plasma or of any medium in which the probe is placed, where $$\varepsilon = \frac{\omega_{R0}^2}{\omega_R^2}.$$

As noted above, the probe used in the method for finding plasma density in accordance with the present invention should be configured such that $\omega_{R0} \gg \omega_{ce}, \omega_{pe}$, where $\omega_{pe}$ is the local plasma electron frequency and $\omega_{ce}$ is the electron cyclotron frequency. Such a properly configured probe can have any one of several possible geometries, including those illustrated in the block diagrams shown in FIGS. 3A-3E.

Figure 3A:
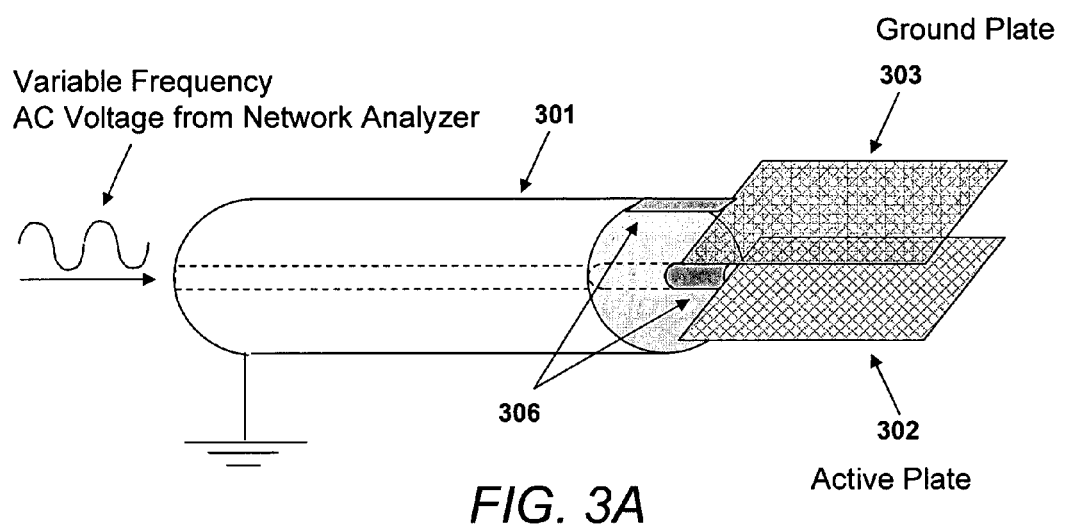
FIGS. 3A-3E illustrate aspects of exemplary configurations of an LC resonance probe apparatus in accordance with the present invention.

For example, as shown in the exemplary configuration illustrated in FIG. 3A, the capacitive element of the probe can be in the form of a parallel plate capacitor comprising active plate 302 and ground plate 303 situated at the end of a coaxial cable 301. Inductive element 306, both for the probe geometry shown in FIG. 3A and for all other probe geometries discussed herein, includes at least the wire connections between the coaxial cable 301 and the capacitive elements and may include other components as well. For example, additional inductance can be added by either lengthening and/or coiling the wires making up the wire connections or by adding a pre-made inductor between the coaxial cable 301 and the capacitive elements.

Coaxial cable 301 is connected to a variable frequency voltage source and circuit analysis equipment (not shown). The circuit analysis equipment can be in the form of a network analyzer known in the art or any other appropriate piece of equipment or set of pieces of equipment configured to receive and process input from the probe.

Figure 3B:
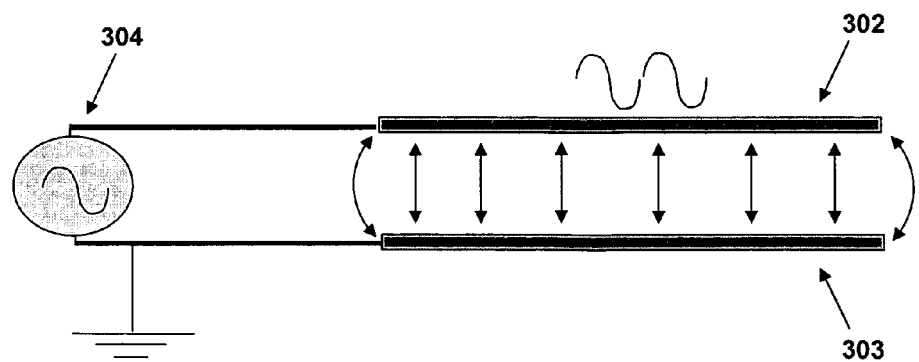

In operation, active plate 302 which receives a variable frequency oscillating voltage 304 from coaxial cable 301 and a ground plate 303 which creates an oscillating electric field between active plate 302 and ground plate 303 as shown in FIG. 3B. This electric field will be affected by the dielectric constant E of the medium in which the probe is situated. As described in more detail below, when the probe shown in FIG. 3A is placed into a plasma, the plasma fill the volume between the active and ground plates 302 and 303 and will alter the oscillating vacuum electric fields shown in FIG. 3B due to the difference in the dielectric constant c of the plasma compared to the dielectric constant of free space $\in_0$.

Figure 3C:
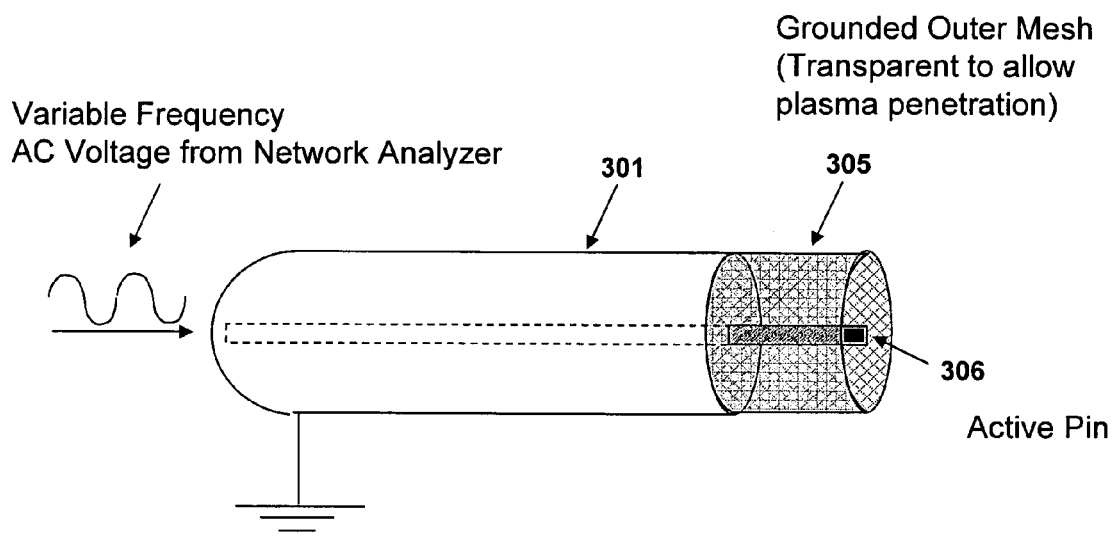
Figure 3D:
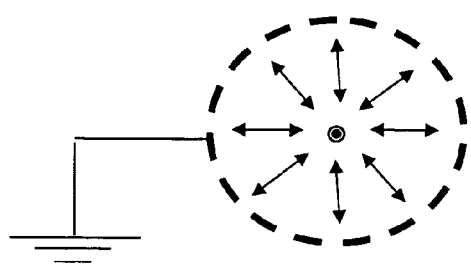

FIGS. 3C and 3D illustrate aspects of another exemplary probe configuration that can be used in accordance with the present invention. As shown in FIG. 3C, an LCR probe in accordance with the present invention can be in the form of a hollow cylindrical capacitor at the end of a coaxial cable 301 connected to an AC voltage source and circuit analysis equipment (not shown). The cylindrical capacitor comprises an active pin 306 at the center thereof, surrounded by a grounded outer cylinder 305. The center pin also serves as the inductive element of the probe in this case. The outer cylinder 305 is in the form of a transparent mesh to permit the plasma to pass through the cylindrical capacitor when the probe is placed into the plasma. As shown in FIG. 3D, in this configuration the electric field generated by the probe is radial, centered at active pin 304 and terminating at the grounded outer cylinder 305.

Figure 3E:
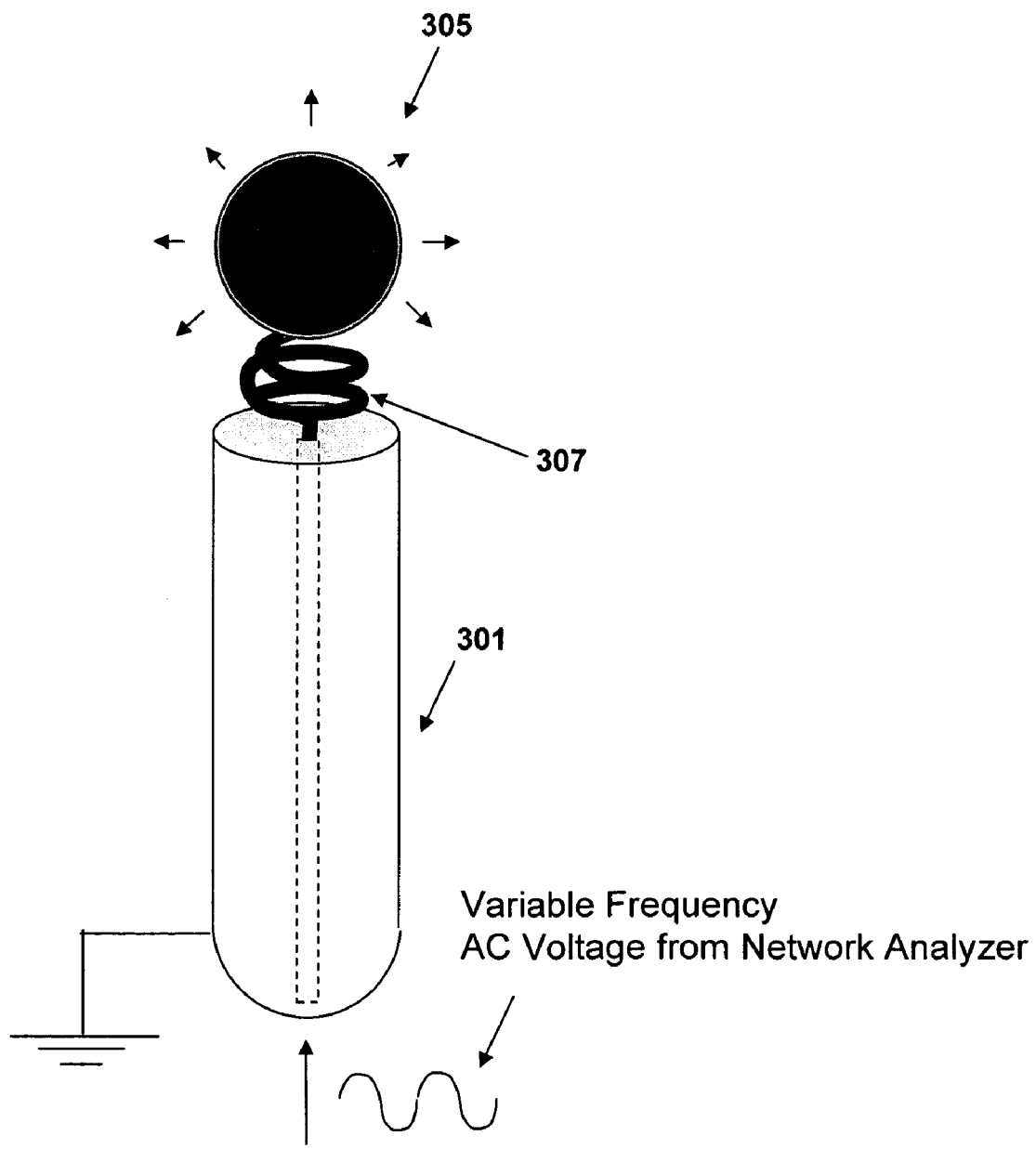

FIG. 3E illustrates a third exemplary probe configuration of an LCR probe apparatus in accordance with the present invention. As shown in FIG. 3E, an LCR probe can be in the form of a spherical capacitor 305 at the end of coaxial cable 301 connected to an AC voltage source providing a variable frequency AC voltage. In this probe configuration or in any of the others described above, an additional inductor can also be included, for example, in the form of coil 307, which as noted above, could be used to tune the resonant frequency $\omega_{R0}$. Also as shown in FIG. 3E, in the case of a spherical probe, the AC electric field radiates outward in all directions from the sphere surface. If there is no built-in ground as there is in the other probe configurations, the field lines terminate at the ground wall of the plasma chamber, and thus such a probe would not provide a local measurement of plasma density though it would be able to provide a measurement of average plasma density within a few probe radii of the probe surface. This is in accordance with the $r^2$ falloff of the electric field around a spherical object. If the spherical probe tip is surrounded by a semi-transparent spherical shell, the density measurement will be localized to the volume between surface of the probe tip and spherical shell.

Figure 4:
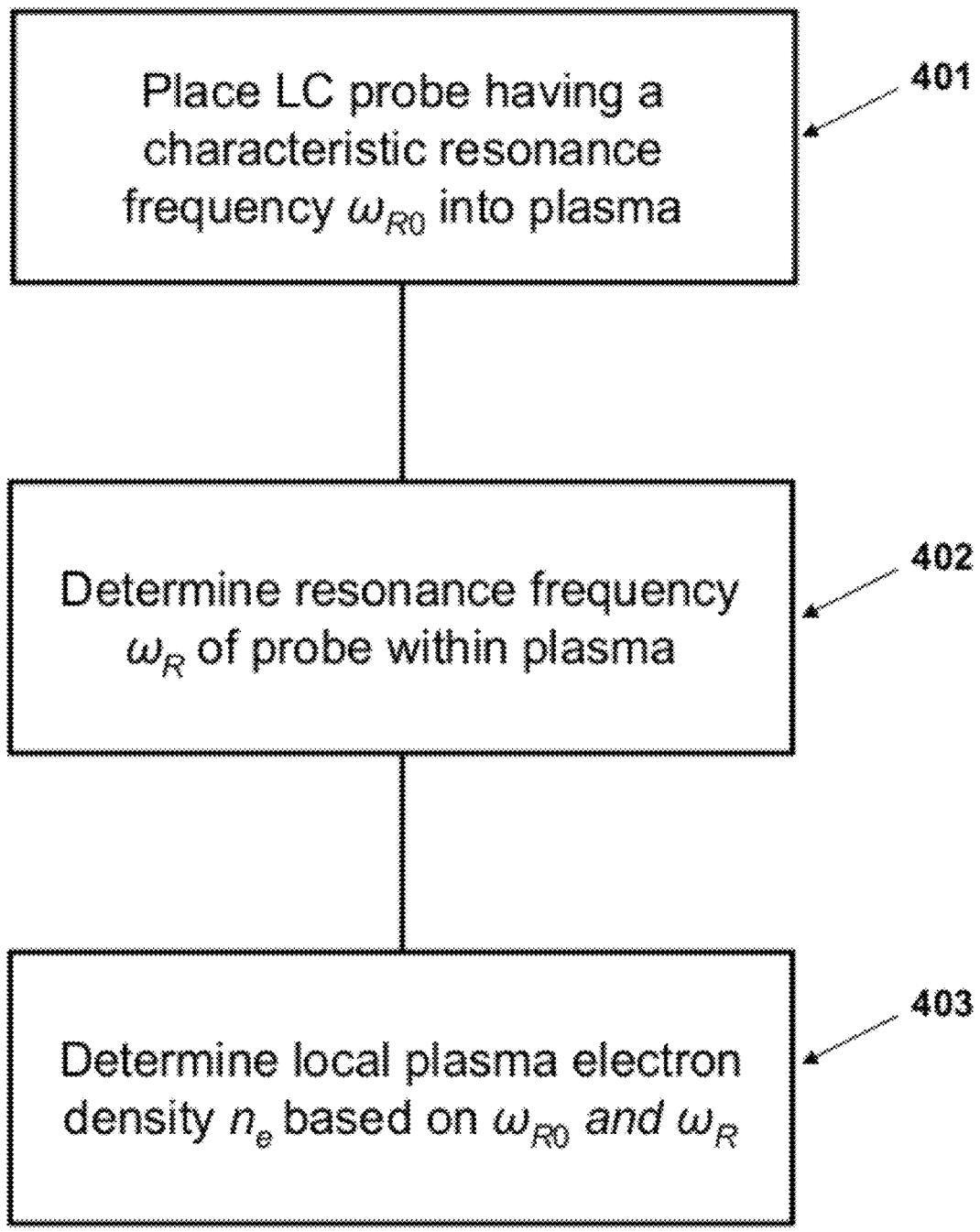
FIG. 4 is a flow chart illustrating steps used in a method for determining local plasma density $n_e$ in accordance with the present invention.

FIG. 4 is a flow chart illustrating exemplary process steps used in a method for determining local plasma density in accordance with the present invention. As shown in FIG. 4 and as described in more detail herein, in a method for determining local plasma density in accordance with the present invention, at step 401, an LC probe, i.e., a probe having a capacitive and an inductive element, is placed in a plasma. As described above, the particular configuration of the probe causes it to have a characteristic resonance frequency $\omega_{R0}$, i.e., the resonance frequency of the probe when it is outside the plasma. At step 402, the resonance frequency $\omega_R$ of the probe when it is within the plasma is determined as described above, and at step 403, the local density of the plasma $n_e$ is determined, where $$n_e = \frac{m_e \varepsilon_0}{e^2}(\omega_R^2 - \omega_{R0}^2).$$

Figure 5:
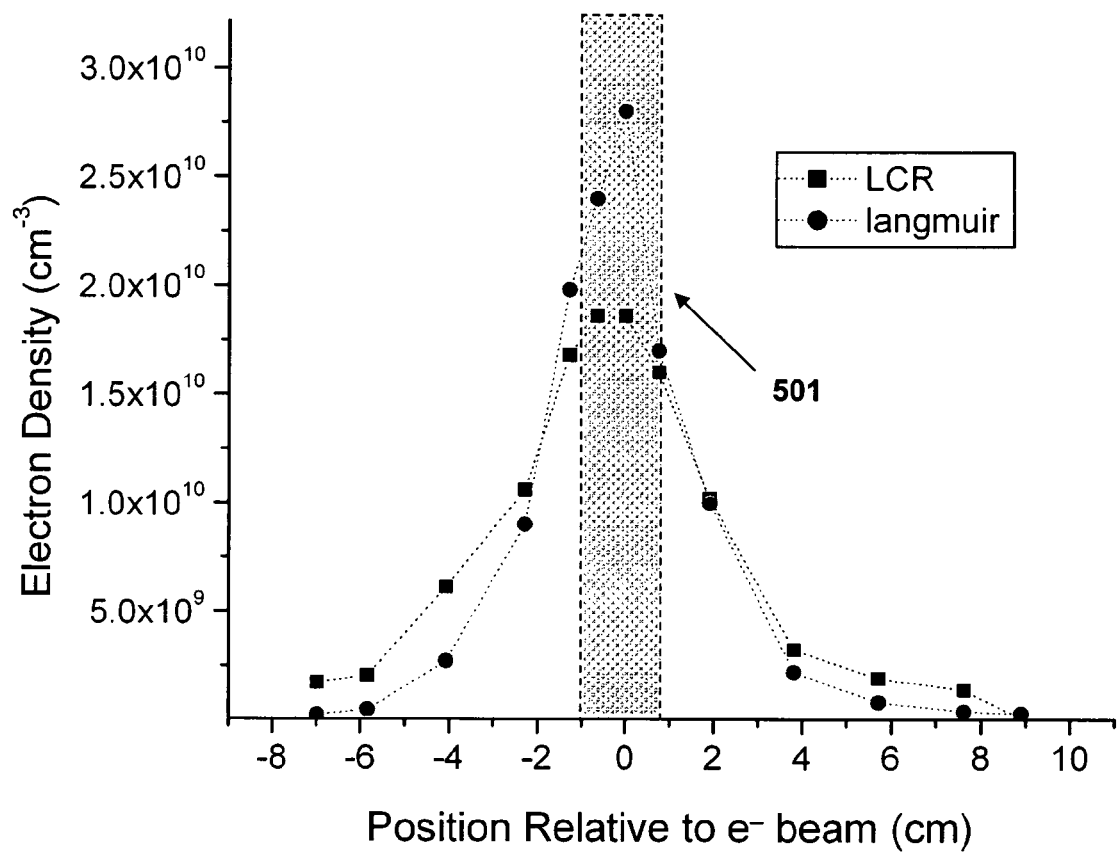
FIG. 5 contains plots showing an exemplary plasma density profile measurement made with a Langmuir probe and with a parallel plate LC resonance probe in accordance with the present invention.
Figure 6:
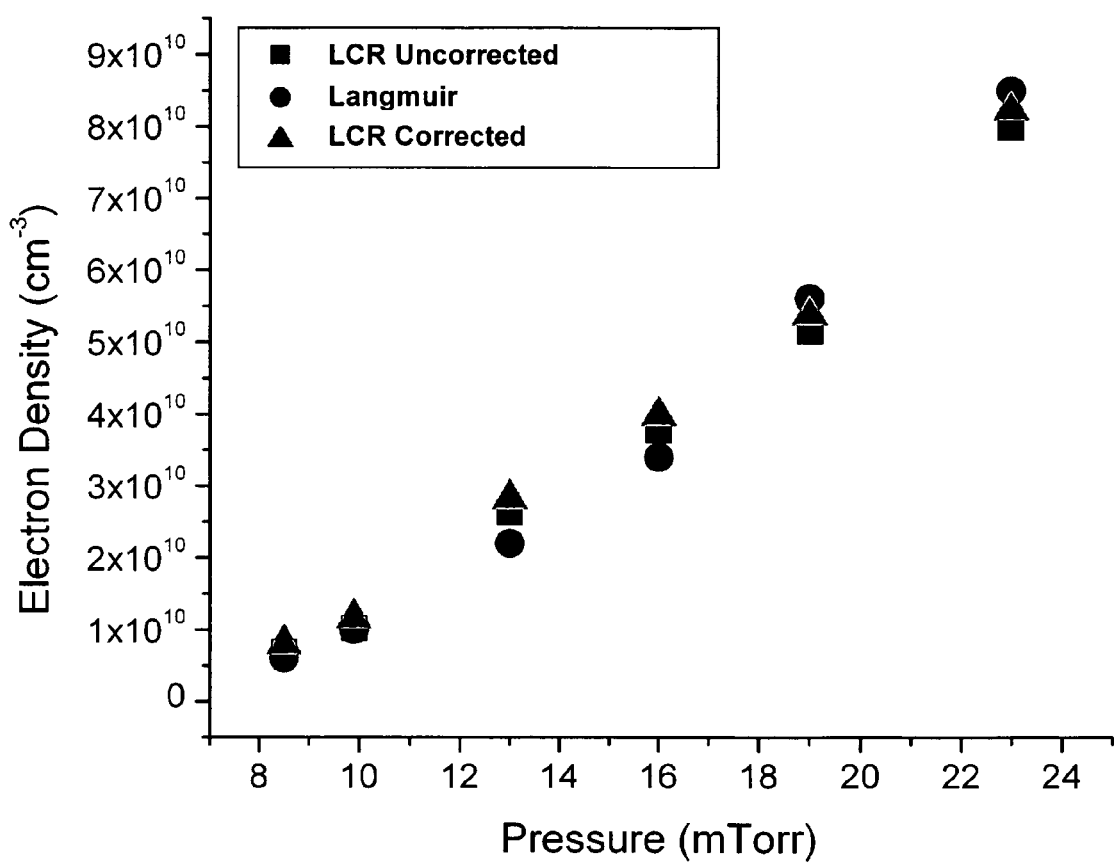
FIG. 6 is a plot comparing electron density measurements made using a Langmuir probe and using a parallel plate LC resonance probe in accordance with the present invention as a function of background gas pressure.
Figure 7:
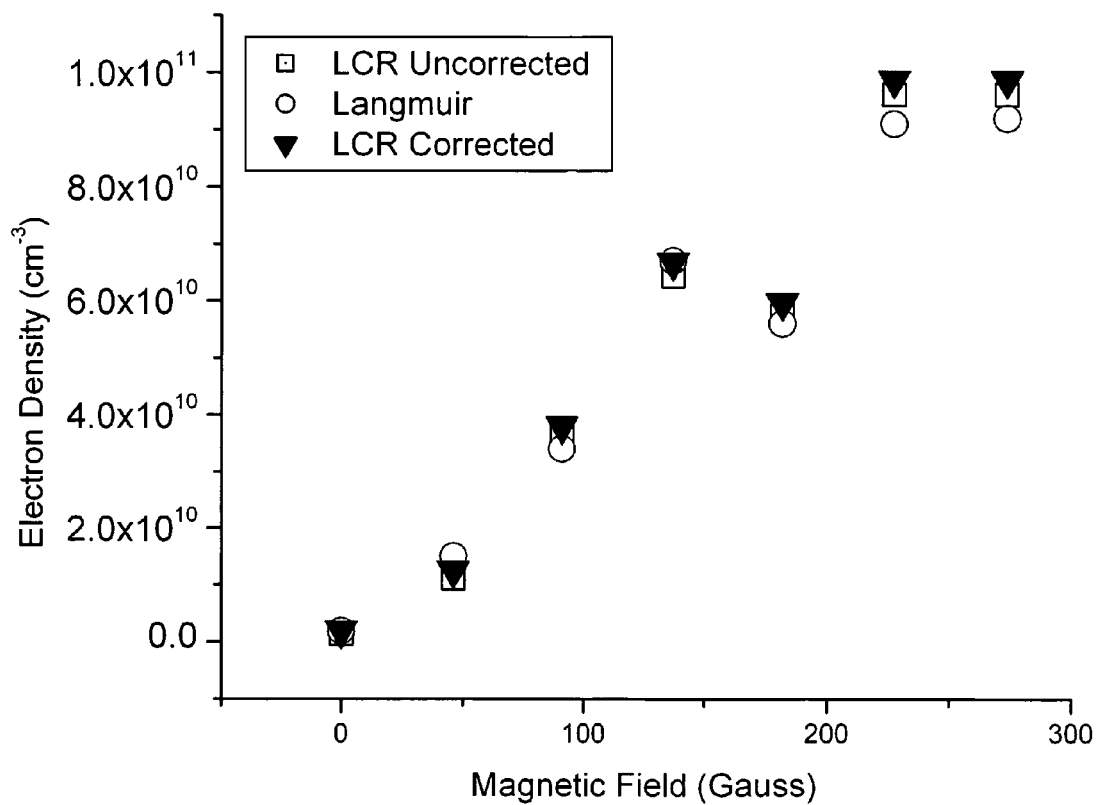
FIG. 7 is a plot comparing electron density measurements made using a Langmuir probe and using a parallel plate LC resonance probe in accordance with the present invention as a function of magnetic field B.

The utility of an LCR probe method in accordance with the present invention for analyzing plasmas is further illustrated by the plots shown in FIGS. 5-7.

FIG. 5 shows a density profile for an electron beam-generated plasma measured by both a parallel plate LCR probe and a Langmuir probe. In this case, the LCR probe's capacitive element consisted of two parallel plates with one plate connected to the center conductor of a rigid coaxial cable and the other plate connected to the outer conductor of the rigid coaxial cable. Outside the electron beam region 501, the Langmuir probe and LCR probe measure essentially identical densities, ranging from about $1 \times 10^9$ cm$^{-3}$ at about $\pm 8$ cm from the electron beam center to about $1.75 \times 10^{10}$ cm$^{-3}$ at about $\pm 2$ cm from the beam center. Within the electron beam region 401, about $\pm 0.5$ cm from the beam center, the Langmuir probe measures a higher plasma density, with the Langmuir probe giving a 35% higher density (about $2.75 \times 10^{10}$ cm$^{-3}$ versus about $1.8 \times 10^{10}$ cm$^{-3}$) at the beam center. An explanation for this disagreement could be due to secondary electron production from high-energy beam electrons striking the Langmuir probe surface and ceramic probe stalk. If so, the LCR probe is more likely to provide an accurate measure of $n_e$, since particle flux is irrelevant.

In addition to density profile measurements; the density measurements obtained using the LCR probe methods of the present invention were also compared to Langmuir probe measurements for varying experimental parameters such as chamber pressure (FIG. 6) and axial magnetic field (FIG. 7). Here again, the LCR probe showed good agreement with the Langmuir probe. The LCR probe and Langmuir probe measurements were taken 1 cm above the electron beam to eliminate the previously discussed complications from the electron beam impacting the Langmuir probe. In FIG. 6, the LCR probe data was acquired using mesh plates as the capacitive element and is presented with and without a vacuum sheath correction to illustrate that at these plasma densities perturbations due to a plasma sheath around the capacitive elements are small. Details on the sheath correction can be found in D. R. Boris, R. F. Fernsler, and S. G. Walton "The LC Resonance probe for determining local plasma density," *Plasma Sources Sci. Technol.* 20 (2011) 025003, the entirety of which is incorporated herein by reference.

As can be seen from the magnetic field scan shown FIG. 7, the LCR probe technique of the present invention is particularly useful in the case of plasmas in a magnetic field, enabling the measurement of plasma density without the measurement being substantially affected by the presence of a magnetic field. In the case illustrated in FIG. 7, a parallel plate probe was placed in a plasma, where the plates consisted of a metallic mesh. The AC electric field was oriented parallel to the magnetic field axis, i.e., $E_{AC} \| B$. In this orientation, the magnetic field has no effect on the plasma dielectric constant $\in_p$, and as can be seen from the plot shown in FIG. 7, there is good agreement between the plasma densities found using a Langmuir probe and an LCR probe in accordance with the present invention, even at magnetic fields as high as 300 Gauss.

The magnetic field has the greatest effect on $\in_p$ when B is perpendicular to the AC electric field $E_{AC}$, i.e., $E_{AC} \perp B$. However, even in that case, the LCR probe of the present invention provides a good measure of plasma electron density $n_e$. Table 1 below compares results obtained for $n_e$ for the case where $E_{AC} \perp B$ with those obtained when $E_{AC} \| B$.

TABLE 1

|  | $n_e$ (cm$^{-3}$) (LCR probe with sheath correction) | $\omega_R$ (rad/s) | $\omega_{R0}$ (rad/s) | $n_e$ (cm$^{-3}$) (Langmuir probe) |
|---|---|---|---|---|
| $E_{AC} \perp B$ | $5.6 \times 10^{10}$ | $1.23 \times 10^{10}$ | $9.16 \times 10^9$ | $7.7 \times 10^{10}$ |
| $E_{AC} \parallel B$ | $5.2 \times 10^{10}$ | $1.21 \times 10^{10}$ | $9.16 \times 10^9$ | $7.7 \times 10^{10}$ |

The two orientations gave essentially the same result for $n_e$ when normalized to the density inferred from the Langmuir probe, showing that the technique is insensitive to the magnetic field. The slight differences reflect typical plasma density fluctuations for this system. They most likely result from the measurements being taken at different locations within a plasma with strong density gradients.

Advantages and New Features.

As described above, the LCR probe apparatus and method of the present invention can accurately measure plasma densities ranging from $10^9$ to $10^{11}$ cm$^{-3}$, with LCR probes capable of measuring $n_e < 10^6$ cm$^{-3}$ having been built. As noted above, the LCR probe is not affected by the presence of a magnetic field. Also note that, unlike Langmuir probes, the LCR probe is also insensitive to surface contamination, ion currents, plasma drift, and low-density electron beams. Moreover, the LCR resonance is sharp and well-defined and so, the LCR analysis is straightforward (no fitting of data to an assumed curve), and magnetic effects can either be incorporated or overcome. These characteristics make LCR probes a viable alternative to Langmuir probes, and superior in situations where the surface of the probe is likely to be altered by the plasma environment. This is especially useful in the wide variety of plasma processing applications where reactive and depositing plasmas are in use.

Since the probe can be constructed to have a resonant frequency unaffected by the magnetic field, it should be equally useful for space plasmas where the orientation of the magnetic field with respect to the probe varies with time and is often unknown. The a priori knowledge of the resonant frequency $\omega_{R0}$ makes constructing data analysis hardware for an LCR probe much simpler than the electronics required to make measurements with antenna based RF probes. This is a significant advantage in space weather applications where added complexity and weight significantly increase launch costs.

The LC resonance probe of the present invention also has an advantage over antenna-based RF probes when a magnetic field is present. Simple antenna-based RF probes are unable to measure the plasma frequency directly when a magnetic field is present. Instead, the upper hybrid frequency must be measured, requiring very accurate knowledge of the local magnetic structure for plasma density to be calculated. See K. Balmain, "Impedance of a Spherical Probe in a Magnetoplasma," *IEEE Trans. Antennas Propag.* AP-14, 402 (1966); D. D. Blackwell, D. N. Walker, S. J. Messer, and W. E. Amatucci "Antenna impedance measurements in a magnetized plasma. I. Spherical antenna," *Phys. Plasmas* 14, 092105 (2007). As noted above, if the LCR probe is properly constructed, the probe characteristic resonance frequency $\omega_{R0}$ can be tuned such that $\omega_{R0} \gg \omega_{ce}$, where $\omega_{ce}$ is the electron-cyclotron frequency. In this frequency range, the plasma dielectric constant, $\epsilon_p(\omega)$, is not significantly affected by the magnetic field.

Thus, the LCR probe can make plasma density measurements in magnetized plasmas without having to compensate for magnetic field effects. The LCR probe differs from the hairpin resonator in that it does not require a standing wave to be present between the plates. This allows the LCR probe to access significantly lower plasma densities than would be possible with a hairpin resonator. Thus LCR probes can be used in a wide range of plasma densities from space weather measurements ($10^6$ cm$^{-3}$ or less) to plasma processing environments ($10^{12}$ cm$^{-3}$).

In addition, the LCR probe can provide a local plasma density measurement over a well defined volume if a parallel plate geometry is used. This is particularly useful for environments where large plasma density gradients are present. Antenna-based RF probe measurements in these environments have been shown to be difficult to interpret. See D. R. Boris, S. G. Walton, M. Baraket, R. F. Fernsler, "Frequency Probe Measurements in Electron Beam Generated Plasmas," *Proceedings of the 53rd Society of Vacuum Coaters Technical Conference*, Orlando Fla. (2010).

As noted above, the method for determining plasma electron density in accordance with the present invention includes computer-implemented aspects where the plasma electron density $n_e$ can be determined by executing one or more sequences of instructions contained in computer-readable program code read into a memory of one or more general or special purpose computers configured to execute the instructions. The computer can include a processor situated within or operatively connected to the probe apparatus, or can consist of an entirely separate device. In some embodiments, the circuit analysis equipment can be configured to provide direct data input into the computer for real-time calculation of the plasma electron density. In other embodiments, the circuit analysis equipment can be configured to store the resonance frequency data in a memory for later processing, with the computer being configured to receive and process the data from the memory to calculate the plasma electron density.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A method for determining an electron density $n_e$ of a plasma, comprising:
   placing a probe into the plasma, the probe comprising a capacitive element connected in series to an inductive element and having a characteristic resonance frequency $\omega_{R0}$, the probe being connected to a voltage source configured to provide a variable frequency AC voltage to the probe;
   determining a resonance frequency $\omega_R$ of the probe within the plasma; and
   calculating plasma electron density $n_e$ at a processor configured to receive and analyze data representative of the probe's characteristic resonance frequency $\omega_{R0}$, the returned resonance frequency $\omega_R$, an electron charge $-e$, a vacuum permittivity $\epsilon_0$, and an electron mass $m_e$, where $$n_e = \frac{m_e \epsilon_0}{e^2}(\omega_R^2 - \omega_{R0}^2).$$

2. The method according to claim 1, further comprising measuring, with the probe, a complex reflection coefficient of the LC circuit element in the presence of a plasma at each of a plurality of frequencies applied to the probe; and determining the resonance frequency $\omega_R$ and characteristic resonance frequency $\omega_{R0}$ based on the complex reflection coefficient.

3. The method according to claim 1, further comprising:

determining, at each of the frequencies applied to the probe, a phase angle $\theta_P$ of an impedance $Z_P$ of the probe when it is in the plasma as a function of the frequency applied to the probe;

determining, at each of the frequencies applied to the probe, a phase angle $\theta_{P0}$ of an impedance $Z_{P0}$ of the probe when it is outside of the plasma as a function of the frequency applied to the probe;

plotting $\theta_P$ and $\theta_{P0}$ as a function of the applied frequency; and determining the values of $\omega_R$ and $\omega_{R0}$ based on the values of $\theta_P$ and $\theta_{P0}$;

wherein $\omega_R$ is a frequency at which $\theta_P$ exhibits a zero crossing and $\omega_{R0}$ is a frequency at which $\theta_{P0}$ exhibits a zero crossing.

4. The method according to claim 1, further comprising:

determining, at each of the frequencies applied to the probe, a value $|Z_P|$ of an impedance $Z_P$ of the probe when it is in the plasma as a function of the frequency applied to the probe;

determining, at each of the frequencies applied to the probe, a value $|Z_{P0}|$ of an impedance $Z_{P0}$ of the probe when it is outside of the plasma as a function of the frequency applied to the probe; and determining the values of $\omega_R$ and $\omega_{R0}$ based on the values of $|Z_P|$ and $|Z_{P0}|$;

wherein $\omega_R$ is a frequency at which the value of $|Z_P|$ exhibits a minimum and $\omega_{R0}$ is a frequency at which the value of $|Z_{P0}|$ exhibits a minimum.

5. The method according to claim 4, further comprising:

plotting $|Z_P|$ and $|Z_{P0}|$ as a function of the applied frequency;

wherein $\omega_R$ is a frequency at which the plot of $|Z_P|$ exhibits a minimum and $\omega_{R0}$ is a frequency at which the plot of $|Z_{P0}|$ exhibits a minimum.

6. A computer-implemented method for determining an electron density $n_e$ of a plasma, comprising:

receiving, at a computer programmed with appropriate software, data representative of a resonance frequency $\omega_R$ of an LCR probe placed within the plasma;

receiving, at the computer, data representative of a characteristic resonance frequency $\omega_{R0}$ of the probe, the values of $\omega_R$ and $\omega_{R0}$ having been determined from an impedance $Z_P$ of the probe at a time when the probe is in the plasma and an impedance $Z_{P0}$ of the probe at a time when the probe is outside the plasma, $Z_P$ and $Z_{P0}$ being determined as a function of a frequency applied to the probe;

receiving, at the computer, data representative of an electron charge $-e$, a vacuum permittivity $\epsilon_0$, and an electron mass $m_e$; and calculating, at the computer, plasma electron density $n_e$, where $$n_e = \frac{m_e \varepsilon_0}{e^2}(\omega_R^2 - \omega_{R0}^2).$$

7. The method according to claim 6, wherein $\omega_R$ is a frequency at which a value $|Z_P|$ of an impedance $Z_P$ of the probe when the probe is in the plasma exhibits a minimum; and wherein $\omega_{R0}$ is a frequency at which a value $|Z_{P0}|$ of the impedance $Z_{P0}$ of the probe when the probe is outside the plasma exhibits a minimum.

8. The method according to claim 6, wherein $\omega_R$ is a frequency at which a phase angle $\theta_P$ of $Z_P$ exhibits a zero crossing; and wherein $\omega_{R0}$ is a frequency at which a phase angle $\theta_{P0}$ of $Z_{P0}$ exhibits a zero crossing.

9. A method for determining the dielectric constant of a medium, comprising:

placing a probe into the medium, the probe comprising a capacitive element connected in series to an inductive element and having a characteristic resonance frequency $\omega_{R0}$, the probe being connected to a voltage source configured to provide a variable frequency AC voltage to the probe;

determining a resonance frequency $\omega_R$ of the probe within the medium; and calculating the relative dielectric constant of the medium $\in$ at a processor configured to receive and analyze data representative of the probe's characteristic resonance frequency $\omega_{R0}$, the returned resonance frequency $\omega_R$, where $$\varepsilon = \frac{\omega_{R0}^2}{\omega_R^2}.$$

10. The method according to claim 9, further comprising:

determining, at each of the frequencies applied to the probe, a value $|Z_P|$ of an impedance $Z_P$ of the probe when it is in the medium as a function of the frequency applied to the probe;

determining, at each of the frequencies applied to the probe, a value $|Z_{P0}|$ of an impedance $Z_{P0}$ of the probe when it is outside of the medium as a function of the frequency applied to the probe; and determining the values of $\omega_R$ and $\omega_{R0}$ based on the values of $|Z_P|$ and $|Z_{P0}|$;

wherein $\omega_R$ is a frequency at which the value of $|Z_P|$ exhibits a minimum and $\omega_{R0}$ is a frequency at which the value of $|Z_{P0}|$ exhibits a minimum.

11. An apparatus for determining local plasma electron density $n_e$, comprising:

a probe situated at a first end of a transmission line, the probe comprising a capacitive element connected in series to an inductive element and having a characteristic resonance frequency $\omega_{R0}$, the probe being configured such that $\omega_{R0} \gg \omega_{ce}, \omega_{pe}$;

a voltage source connected to the second end of the transmission line, configured to provide a variable frequency AC voltage to the probe via the transmission line;

a signal processing device also connected to the second end of the transmission line configured to measure a resonance frequency $\omega_R$ of the plasma returned when the probe is placed into the plasma;

a data processor configured to receive and process data of the characteristic resonance frequency $\omega_{R0}$ and the resonance frequency $\omega_R$ of the plasma from the network analyzer;

wherein the processor determines the plasma electron density $n_e$ from the characteristic resonance frequency $\omega_{R0}$ and the returned plasma resonance frequency $\omega_R$, the electron charge $-e$, the vacuum permittivity $\in_0$, and the electron mass $m_e$, wherein $$n_e = \frac{m_e \varepsilon_0}{e^2}(\omega_R^2 - \omega_{R0}^2).$$

12. The apparatus according to claim 11, wherein the capacitive element comprises a parallel plate capacitor.

13. The apparatus according to claim 11, wherein the capacitive element comprises a cylindrical capacitor.

14. The apparatus according to claim 11, wherein the capacitive element comprises a spherical capacitor.

15. The apparatus according to claim 11, wherein the voltage source and signal processing device are combined in one device.

* * * * *